United States Patent
Hein

(10) Patent No.: US 7,221,292 B2
(45) Date of Patent: May 22, 2007

(54) CIRCUIT FOR PRODUCING A DATA BIT INVERSION FLAG

(75) Inventor: Thomas Hein, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/361,768

(22) Filed: Feb. 24, 2006

(65) Prior Publication Data

US 2006/0261929 A1     Nov. 23, 2006

(30) Foreign Application Priority Data

Mar. 22, 2005  (DE) .................. 10 2005 013 322

(51) Int. Cl.
*H03M 5/00* (2006.01)
(52) U.S. Cl. ........................ 341/55; 341/144
(58) Field of Classification Search ............... 341/144, 341/55, 53, 150
See application file for complete search history.

(56) References Cited

U.S. PATENT DOCUMENTS

| | | | |
|---|---|---|---|
| 4,006,475 A * | 2/1977 | Candy et al. ............... 341/145 |
| 6,243,779 B1 | 6/2001 | Devanney et al. | |
| 6,509,857 B1 * | 1/2003 | Nakao ........................ 341/153 |
| 6,721,456 B1 * | 4/2004 | Aschenbrenner et al. ... 382/233 |
| 6,977,534 B2 * | 12/2005 | Radelinow .................. 327/112 |
| 2003/0158981 A1 | 8/2003 | LaBerge | |

* cited by examiner

*Primary Examiner*—Peguy JeanPierre
(74) *Attorney, Agent, or Firm*—Jenkins, Wilson, Taylor & Hunt, P.A.

(57) ABSTRACT

A circuit for producing a data bit inversion flag comprises a first summed-current production unit for producing a first summed current, whose amplitude is proportional to the number of different data bits in two adjacent data words in a data burst, a second summed-current production unit for producing a second summed current, whose amplitude is proportional to the number of identical data bits in the two adjacent data words, and a current comparator comparing the first with the second summed current and producing a data bit inversion flag if the first summed current is greater than the second summed current.

24 Claims, 17 Drawing Sheets

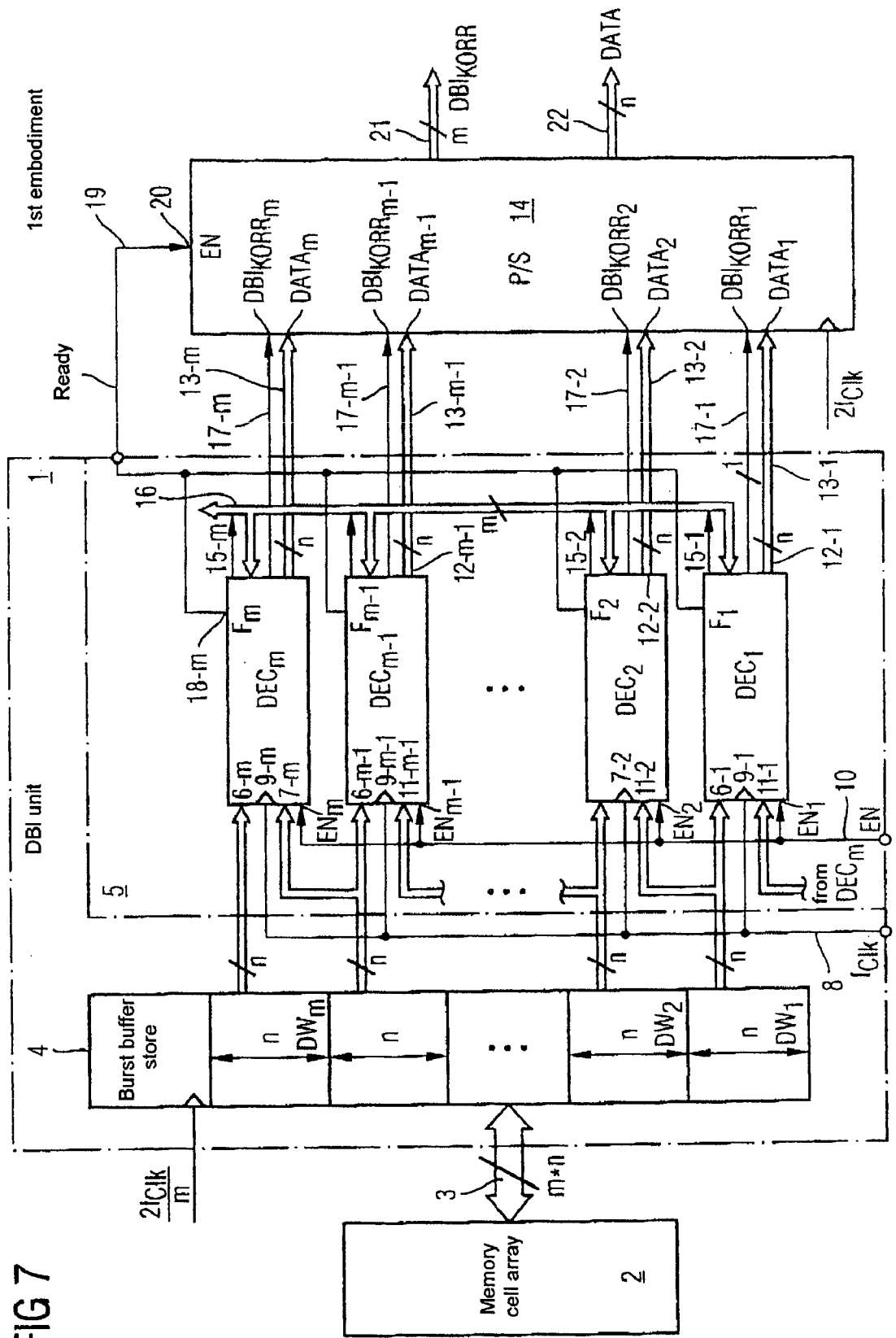

FIG 9

| Calculated DBI values | | | | Correct DBI values | | | |
|---|---|---|---|---|---|---|---|
| DBI<1> | DBI<2> | DBI<3> | DBI<4> | DBI< > | DBI< > | DBI< > | DBI< > |
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 1 |
| 0 | 0 | 1 | 1 | 0 | 0 | 1 | 0 |
| 0 | 1 | 0 | 0 | 0 | 1 | 1 | 1 |
| 0 | 1 | 0 | 1 | 0 | 1 | 1 | 0 |
| 0 | 1 | 1 | 0 | 0 | 1 | 0 | 0 |
| 0 | 1 | 1 | 1 | 0 | 1 | 0 | 1 |
| 1 | 0 | 0 | 0 | 1 | 1 | 1 | 1 |
| 1 | 0 | 0 | 1 | 1 | 1 | 1 | 0 |
| 1 | 0 | 1 | 0 | 1 | 1 | 0 | 0 |
| 1 | 0 | 1 | 1 | 1 | 1 | 0 | 1 |
| 1 | 1 | 0 | 0 | 1 | 0 | 0 | 0 |
| 1 | 1 | 0 | 1 | 1 | 0 | 0 | 1 |
| 1 | 1 | 1 | 0 | 1 | 0 | 1 | 1 |
| 1 | 1 | 1 | 1 | 1 | 0 | 1 | 0 |

CIRCUIT FOR PRODUCING A DATA BIT INVERSION FLAG

BACKGROUND OF THE INVENTION

1. Field of the invention

The invention relates to a circuit for producing a data bit inversion flag for the purpose of data inversion for a data burst which has been read from a memory chip, in particular for DDR-SDRAMs (Double Data Rate Synchronous Dynamic Random Access Memories).

2. Description of the Prior Art

FIG. 1 shows a computer system based on the prior art in which a memory chip and a controller chip interchange data via a common data bus. The increasing speed of computer processors or controllers requires a correspondingly higher speed for memory access operations or faster memory chips. The memory chip and the processor are clocked by means of a clock signal CLK.

Various generations of RAM stores have been developed, whose access rate rose constantly. The intervals of time in which new data which are read from the memory cell array or which are to be written are available at the data inputs/outputs of the memory chip in question were constantly shortened during this time. Taking synchronous dynamic RAMs (SDRAMs) as a basis, what are known as DDR-SDRAMs were developed, which have double the data rate. Such DDR-SDRAMs deliver data twice as quickly as conventional SDRAMs. DDR-SDRAMs do not double the clock rate, however, but rather two actions are executed in one clock cycle. Whereas conventional SDRAMs are always synchronized only to the rising clock edge of the bus clock, a DDR-SDRAM uses both the rising clock edge and the falling clock edge for data and command transmission.

The data transmission rate of the DDR-SDRAM, which corresponds to a double clock frequency, is almost 2 GHz for clock frequencies in the range from 800 MHz to 1 GHz.

During read access to the memory chip, data are read as a data burst, each data burst comprising a plurality of data words which each comprise a predetermined number n of data bits. The number of data bits within a data word corresponds to the bus width N of the data bus. In one data burst, for example, 4 data bits (m=4) each comprising 8 bits (n=8) are read. FIG. 2 shows the reading of a data burst from an SDRAM based on the prior art. The increasing operating frequency means that the inductive and capacitive coupling is increased, so that data corruptions arise. As the operating frequency increases, it becomes ever more difficult to transmit the data from the memory chip to the controller. A limitation in this context is the noise on the data lines of the data bus. The noise limits the validity period of the data and reduces the "data eye size". The more switching operations or data transitions occur on the data lines, the more the data corruptions increase, i.e. the bit error rate (BER) rises.

FIG. 3 shows the transmission of a data burst during a read access operation from a memory chip to a controller in a conventional data processing system based on the prior art. In the example shown in FIG. 3, a data burst containing 8 data words each comprising 8 bits is transmitted. When the memory chip has received a read instruction RD from the controller via a control bus, it transmits a data burst to the controller via the data bus after a certain latency. In the example shown, the memory chip transmits the following sequence of data words, namely: FF, 00, 00, EF, FF, 00, 02, FF. FIG. 3 indicates the number of bits arising in this context which change their value when moving from one data word to the next data word.

When moving from the first data word (FF) to the second data word (00), all the bits in the data word change their logic value. In the case of the next transition, none of the bits changes its logic value. When moving from the data word 00 to the data word EF, seven bits change their logic value.

To limit the noise caused by the switching, the GDDR4 (Graphics Data Double Rate) standard introduces what is known as data bit inversion (DBI). In this case, before the data are transmitted, a decoder is used internally in the memory chip to check how many data bits in a data word have changed relative to the data bit transmitted directly beforehand in the preceding data word. If the number of data bits which have changed exceeds half of the data bits in the data word, all the data bits in the subsequent data word are transmitted to the controller on the data bus in inverted form. The inversion of the data bits in the data word is indicated to the controller by additional transmission of a DBI flag. FIG. 4 shows such data bit inversion based on the prior art and for the example shown in FIG. 3.

Since more than half, namely, eight data bits change data state between the first two data words (FF, 00), the second data word is transmitted in inverted form as FF. Since likewise more than half of the data bits change their state between the inverted data word FF and the next data word 00 which is to be transmitted, the third data word is also transmitted to the controller in inverted form and as FF. Since only one data bit transition and hence less than half the number of data bits within a data word is inverted between the third inverted transmitted data word and the next data word EF to be transmitted, the fourth data word EF is transmitted to the controller in uninverted form etc. As can be seen from FIG. 4, the number of data bit transitions or switching bits is much smaller than in the case of a data transmission without data bit inversion, as shown in FIG. 3. FIG. 4 also shows the data bit inversion flag DBI transmitted in parallel, which indicates to the processor whether or not the received data word has been inverted.

FIG. 5 shows a circuit unit for data bit inversion in a data burst which has been read from a memory chip, based on the prior art. From the memory cell array, the entire data burst which has been read is first of all buffer-stored in a burst buffer store. By way of example, the burst buffer store is used to buffer-store m=4 data words each containing n=8 data bits. For each data word DW within the burst buffer store, an associated decoder is provided, for example m=4 decoders. Each decoder compares the data bits in a data word with those data bits in the preceding data word.

FIG. 6a shows a circuit design for a conventional decoder, as is used in the data bit inversion unit based on the prior art shown in FIG. 5. The data word which has been read from the burst buffer store is loaded into a register when an ENABLE signal (EN) is received.

At the same time, the preceding data word ($DW_{i-1}$) in the data burst is likewise loaded into a register as a reference data word. FIG. 6b shows a conventional circuit arrangement for a DBI decision circuit based on the prior art. An XOR logic circuit compares the data content of the two registers bit by bit. A counting device counts the number of different data bits. A comparator compares the number of different data bits in the two data words with half the number of data bits within a data word. If the number of data bits within a data word is 8 bits, for example, the comparator compares the rounded-up number of different data bits with the value 4. If the number of different data bits is greater than half the number n of data bits within the data word, a data bit inversion flag (DBI) is set by the comparator. The DBI flag controls a multiplexer in the decoder internally. The data word $DW_i$ buffer-stored in the first register is switched through by the multiplexer either in inverted form or in uninverted form. When the comparator sets the DBI flag, there follows bit-by-bit inversion of the data bits. Once the comparator has finished the comparison, it forwards a READY indicator control signal to the next decoder within the cascade.

As can be seen from FIG. 5, the data words DW which are output by the decoders are applied to a parallel/serial converter which is activated by the READY control signal from the last decoder within the cascade. The parallel/serial converter converts the received data words and the associated data bit inversion flags into a serial data stream. A data bus is used to output a data burst comprising m data words, which each have a bit length n, and also m data bit inversion flags to the controller. As can be seen from FIG. 5, the decoders in the data bit inversion unit based on the prior art operate in serial fashion. The decoders are connected up as a cascade, i.e. a decoder I within the cascade always requires the output value from the preceding decoder i-1 within the cascade as reference data word in order to be able to make the necessary comparison. The parallel/serial converter P/S cannot start to convert the data words available in parallel form into a serial sequence until after the last decoder $DEC_m$ within the cascade has finished the comparison and activates it by means of an ENABLE signal. The waiting time is thus m times the necessary decoding time for a decoder i within the cascade:

$$T_{wait} = m \cdot T_{DEC}$$

If the decoding time for a decoder $DEC_i$ within the cascade is 1 nanosecond, for example, and if a data burst comprises m=4 data words then the waiting time is 4 ns.

The increased waiting time results in an unwanted delay in the memory access time for data within the memory chip. This has an overall negative effect on the system performance. The serial processing during the DBI assessment results in a long time delay for the parallel data transmission, since it is necessary to wait until the decoding of the last data word within the data burst has ended. All the data which have already been processed have to wait this time until they can be processed further in parallel.

FIG. 6c shows an alternative conventional circuit arrangement for a DBI decision circuit within a decoder based on the prior art. In this conventional DBI decision circuit, the different data bits which an EXOR circuit detects between two adjacent data words are supplied to a memory in which a table is stored. For each of the $2^n$ possible values, the stored table contains an associated data bit inversion flag value. If the number n of data bits within a data word DW is 8 bits, for example, then there are $2^8=256$ possible combinations. For each combination for which the number of data bits having the value 1 is more than half n/2 the number n=8 of data bits within the data word, the stored data bit inversion flag DBI has a logic high value. Conversely, for each combination for which the number of logic high data bits is less than half the number n of data bits within a data word DW, the associated data bit inversion flag DBI is stored with the value 0. The memory thus forms a full decoder for all $2^n$ bit combinations. The memory may be replaced by a logic circuit.

Both the data bit inversion decision circuit shown in FIG. 6b and the data bit inversion decision circuit shown in FIG. 6c based on the prior art are relatively slow. The necessary time for producing the data bit inversion flag DBI is thus relatively long, which means that the memory access time for accessing the memory chip is increased overall.

A further drawback of the conventional data bit inversion decision circuits shown in FIGS. 6b and 6c is that the circuit complexity is likewise relatively high, which means that the chip area required for integration of a semiconductor chip is large. This increases the costs of implementation.

It is an object of the present invention to provide a circuit for producing a data bit inversion flag in which the time required for producing the data bit inversion flag is minimal, which means that the memory access time is reduced.

The object is achieved in accordance with the invention by means of a circuit for producing a data bit inversion flag, having:

a first summed-current production unit for producing a first summed current, whose amplitude is proportional to the number of different data bits in two adjacent data words in a data burst, a second summed-current production unit for producing a second summed current, whose amplitude is proportional to the number of identical data bits in the two adjacent data words in the data burst; and having a current comparator which compares the two summed currents produced with one another and produces the data bit inversion flag if the first summed current is larger than the second summed current.

The inventive circuit for producing a data bit inversion flag may be preferably of purely analogue design. In comparison with the conventional DBI decision circuit, this avoids counting the EXOR results, which takes at least n clock cycles. The inventive circuit thus operates considerably more quickly.

In comparison with the conventional DBI decision circuit with full decoding, as shown in FIG. 6c, the inventive circuit avoids the relatively slow addressing and reading from a memory and the long signal propagation times which are required for an implementation with a logic gate. The inventive DBI decision circuit is thus much faster and, on account of the low circuit complexity, requires far less area for integration on a chip.

The idea on which the inventive circuit and the inventive method are based is to compare the number of different data bits in two adjacent data words in a data burst and the number of identical data bits in the two adjacent data words in the data burst with one another using a current balance.

The two summed-current production units may each be formed from transistors connected in parallel which are switched on the basis of the data bits.

Particularly, two adjacent data words may each be provided with an added supplementary data bit which has a firmly prescribed logic value, so that the number n of data bits within a data word is always uneven. By adding such a supplementary data bit with a fixed logic value, for example with a logic value 1, a certain decision is made even if the number of different data bits between two adjacent data words DW is precisely n/2. If the data words each comprise 8 bits, for example, and if precisely 4 bits of the two adjacent data words are unequal, then without adding a supplementary data bit the current balance would not swing distinctly in favour of inversion or noninversion.

The current comparator may be formed by a differential amplifier. This current comparator is preferably likewise of purely analogue design but delivers a digital result in the form of a data bit inversion flag.

The current comparator may be a clocked current comparator which is clocked by a data clock signal. This has the particular advantage that the current drawn by the inventive circuit for producing a data bit inversion flag is reduced overall, because clocked current comparators generally operate more quickly and draw no static current.

The current comparator may contain two inversion stages which each comprise two complementary transistors. The two complementary transistors in the first inversion stage may be connected to one another at a first node and the two complementary transistors in the second inversion stage may be connected to one another at a second node.

The invention circuit may be activated by a start control signal.

The current comparator may be connected to the first summed-current production unit at a third node and to the second summed-current production unit at a fourth node. The third node and the fourth node may particularly be shorted by means of at least one transistor when the inventive circuit has been deactivated.

The first node and the second node may held at a prescribed supply potential in the deactivated state of the inventive circuit by means of a PULL-UP circuit, the PULL-UP circuit may have transistors which are switched on the basis of the start control signal, and the two summed-current production units may be connected to one another at a fifth node.

The fifth node may be connected by a transistor to a prescribed supply voltage potential on the basis of the start control signal.

The data bit inversion flag may be tapped off for output thereof at the first node.

The first node and the second node are connected to a NAND gate for producing a Ready indicator signal (Ready).

The data bit inversion flag produced may control a multiplexer which takes the data bit inversion flag as a basis for switching through the present data word from the two adjacent data words in the data burst in inverted or uninverted form.

The transistors may be formed by MOS field-effect transistors. Particularly the MOS field-effect transistors may be N-MOS field-effect transistors.

The object is also achieved in accordance with the invention by means of a method for producing a data bit inversion flag, having the following steps, namely:

(a) a first summed current, whose amplitude is proportional to the number of different data bits in two adjacent words in a data burst, is produced;

(b) a second summed current, whose amplitude is proportional to the number of identical data bits in two adjacent data words in a data burst, is produced;

(c) the two summed currents produced are compared with one another; and (d) the data bit inversion flag is produced if the first summed current is larger than the second summed current.

DESCRIPTION OF THE DRAWINGS

FIG. 7 is a first embodiment of an inventive circuit unit for data bit inversion which contains decoders with a data bit inversion decision circuit.

FIG. 9 is a table of the data bit inversion flags stored within a correction unit of the decoder of FIG. 8.

DESCRIPTION OF THE PREFERRED EMBODIMENTS

Figure 1:
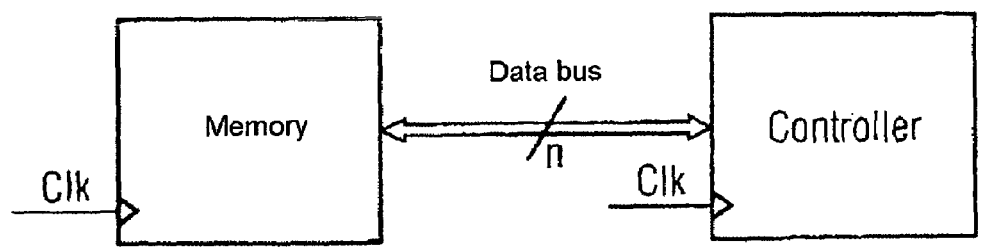
FIG. 1, as discussed above, is a circuit arrangement based on the prior art.
Figure 2:
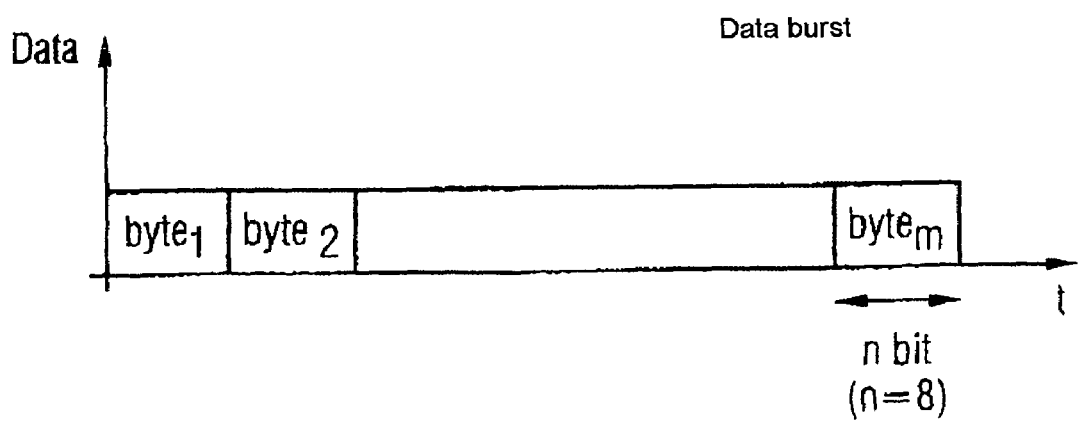
FIG. 2, as discussed above, is the design of a data burst based on the prior art.
Figure 3:
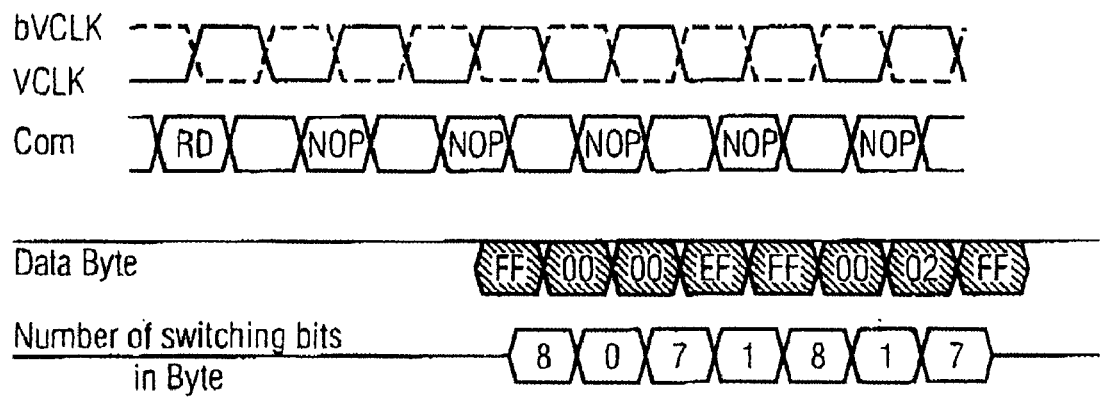
FIG. 3, as discussed above, is the reading of a data burst from a DRAM without data bit inversion based on the prior art.
Figure 4:
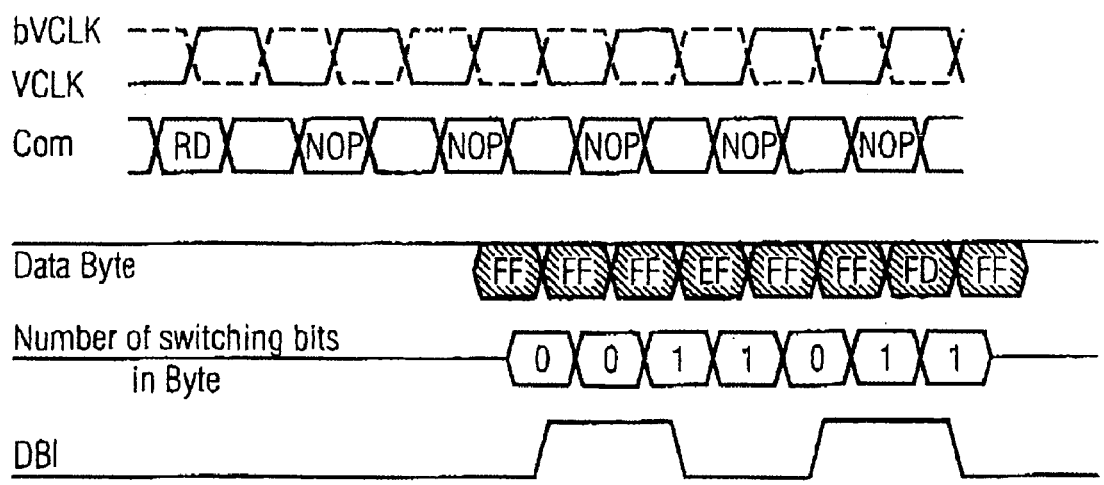
FIG. 4, as discussed above, is the reading of a data burst from a DRAM with data bit inversion based on the prior art.
Figure 5:
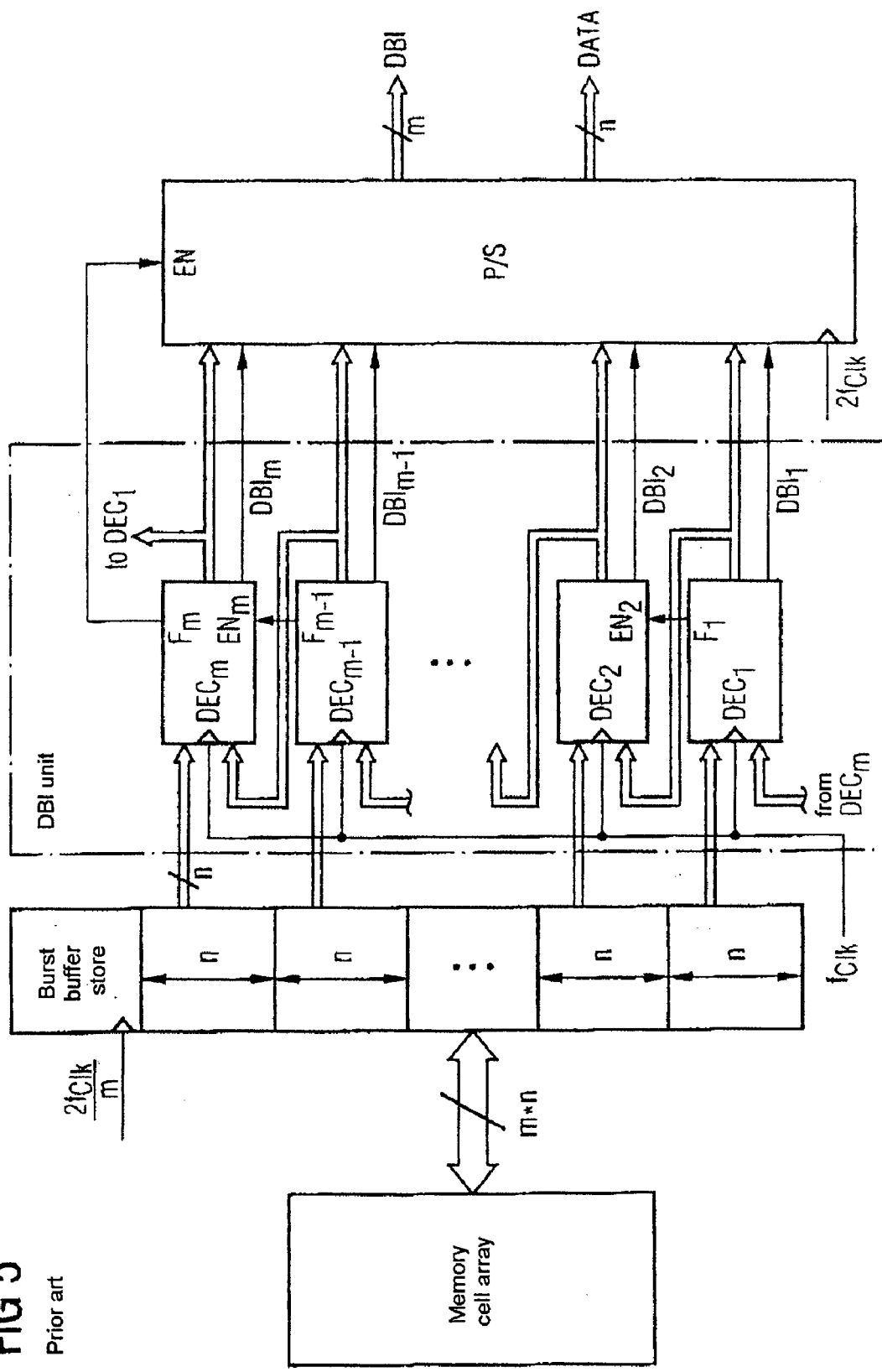
FIG. 5, as discussed above, is a circuit unit for data bit inversion in a data burst which has been read from a memory chip, based on the prior art.
Figure 6A:
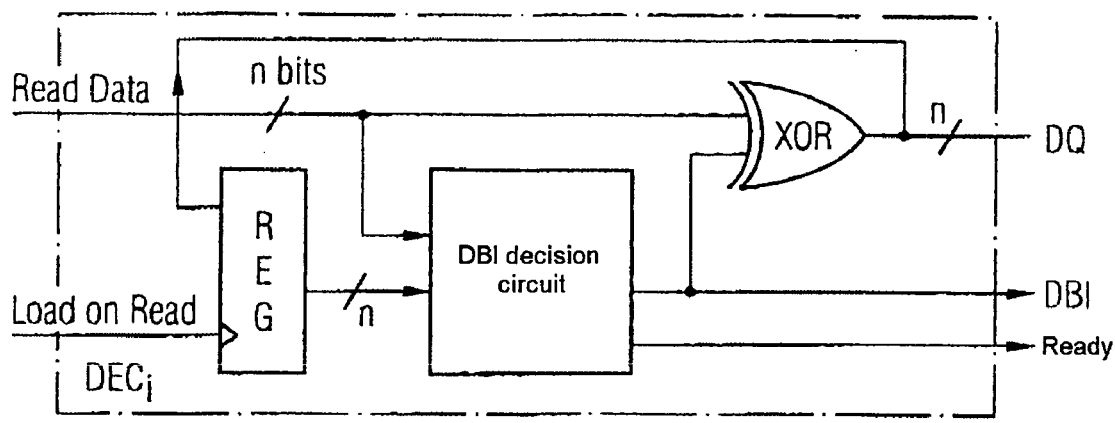
FIG. 6a, as discussed above, is a block diagram of a decoder within the conventional circuit unit for data bit inversion based on the prior art, as illustrated in FIG. 5.
Figure 6B:
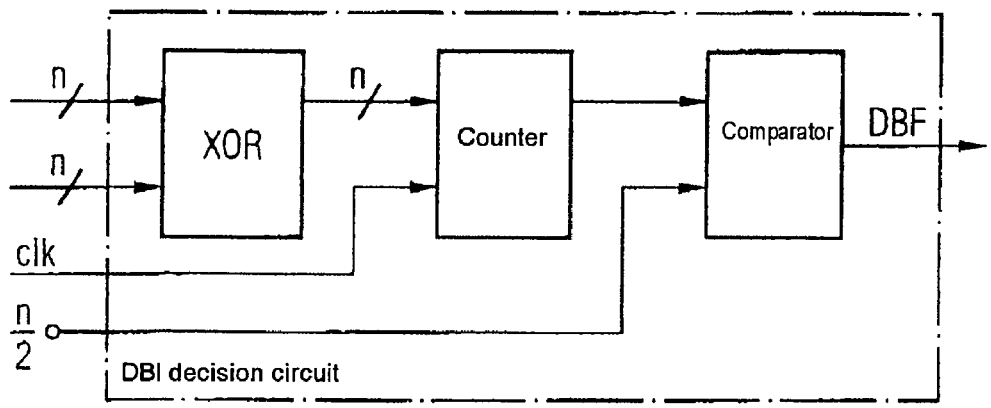
FIG. 6b, as discussed above, is a conventional data bit inversion decision circuit based on the prior art.
Figure 6C:
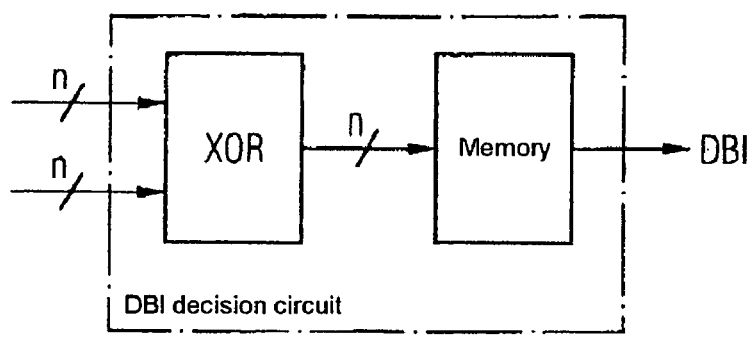
FIG. 6c, as discussed above, is another conventional data bit inversion decision circuit based on the prior art.

FIG. 7 shows a first embodiment of a circuit unit 1 for data bit inversion in a data burst which has been read from a memory chip, which embodiment contains a circuit for producing a data bit inversion flag (DBI) based on the invention. The circuit unit 1 is integrated within the memory chip and forms part of the read signal path. The memory chip contains a memory cell array 2 having a multiplicity of memory cells for storing data bits. An internal data bus 3 is used to buffer-store all the data bits from a data burst which is to be read in a burst buffer store 4 in the circuit unit 1. If the data burst comprises m data words each containing n data bits, m n data bits are simultaneously written to the burst buffer store 4. The circuit unit 1 contains a decoding unit 5 which comprises a plurality of decoders 5-$i$ connected up in parallel. For each data word $DW_i$, an associated decoder 5-$i$ is provided within the decoder unit 5. Each decoder 5-$i$ respectively compares the associated data word $DW_i$ applied to it from the buffer-stored data burst DB with an adjacent data word $DW_{i-1}$ from the buffer-stored data burst DB bit by bit. A first data input 6-$i$ of the decoder 5-$i$ receives the associated data word $DW_i$ from the buffer-stored data burst DB. A second data input 7-*i* of the decoder 5-*i* respectively receives the adjacent data word from the buffer-stored data burst DB as reference data word. Each decoder 5-*i* compares the data word applied to the first data input 6-*i* from the buffer-stored data burst DB with the adjacent data word, applied to the second data input 7-*i*, bit by bit and produces an inversion flag $DBI_i$ if the number of different data bits in the two adjacent data words is more than half the number n of data bits within a data word. As can be seen from FIG. 7, the decoders within the decoding unit are connected up in parallel and are clocked in sync via a common clock line 8. Each decoder 5-*i* has a clock input 9-*i*. The parallel-connected decoders 9-*i* in the decoding unit 5 are activated by a common activation signal (Enable) via a control line 10. Each decoder contains an Enable control input 11.

In the circuit shown in FIG. 7, each decoder has a data output 12 for outputting the applied data word $DW_i$ in inverted or uninverted form. The inverted or uninverted data words which are output by the decoders 5-*i* are output to a downstream parallel/serial converter 14 via an internal data bus 13-*i*. In this case, each decoder 5-*i* in the circuit shown in FIG. 7 generates a data bit inversion flag which is likewise output to the parallel/serial converter 14 via an output line 15. The data bit inversion flags DBI which are output by the decoders 5-*i* are applied to all the other decoders 5-*i* within the decoding unit 5 via an internal bus 16. In the arrangement shown in FIG. 7, an integrated correction unit provided within the decoders 5-*i* takes the inversion flags $DBI_i$ produced by all the other decoders as the basis for producing a respective corrected inversion flag ($DBI_{CORR}$) in each decoder, said corrected inversion flag being output to the parallel/serial converter 14 via a data line 17-*i*. As soon as a decoder 5-*i* has finished the decoding, it indicates this at a control output 18-*i*. The indicator outputs of the decoders 5-*i* are connected to an activation input (Enable) 20 of the parallel/serial converter 14 via a common control line 19. As soon as all the decoders 5-*i* in the circuit unit 1 have finished the decoding, the parallel/serial converter 14 starts the conversion. The parallel/serial converter 14 converts the data words DW received from the decoding units and the associated corrected inversion flags DBI from parallel to serial and outputs them as a data burst DB from the memory chip. The corrected inversion flags $DBI_{CORR}$ are read via an m-bit data bus 21 and the data words are read via an n-bit data bus 22. In this way, the data burst DB is transmitted serially to the controller.

In line with the invention, the data words DW in the data burst DB which are buffer-stored in the burst buffer store 4 are assessed by the decoding unit 5 in parallel for all the available data bits at the same time. As soon as the decoders 5-*i* in the decoding unit 5 have received the activation signal via the control line 10, they start the decoding operation. The reference data word used is the adjacent data word $DW_{i-1}$ applied to the second data input 7-*i*. Since the decoders 5-*i* have no information at this time about whether or not the data value used as reference data word needs to be inverted itself, a correction unit performs appropriate recorrection. As soon as the decoding by the decoders 5-*i* has concluded, the control line 19 is used to activate the parallel/serial converter 14, which outputs the data words DW output by the decoding unit 5 and the corrected data bit inversion flags.

Since the decoders 5-*i* in the decoding unit 5 all operate simultaneously in parallel, the waiting time is made up of the processing time in a decoder and that time which is required for the recorrection:

$$T_{WAIT} = T_{DEC} + T_{CORR} < m\, T_{DEC}$$

If a data burst comprises m=4 data words and if the decoding time in a decoder 5-*i* is 1 ns, for example, then the waiting time in a conventional circuit unit for data bit inversion is 4 1 ns, whereas in the inventive circuit unit 1 for data bit inversion the waiting time is just 1 ns plus that time which is required for the recorrection. Since the time required for the recorrection is very short and typically below 1 ns, the waiting time in the inventive circuit unit for data bit inversion is less than 2 ns and thus less than half that decoding time which is required in a conventional circuit unit for data bit inversion. The reduced waiting time $T_{WAIT}$ for decoding means that the memory access time in a memory chip which contains the inventive circuit unit for data bit inversion is significantly reduced.

Figure 8:
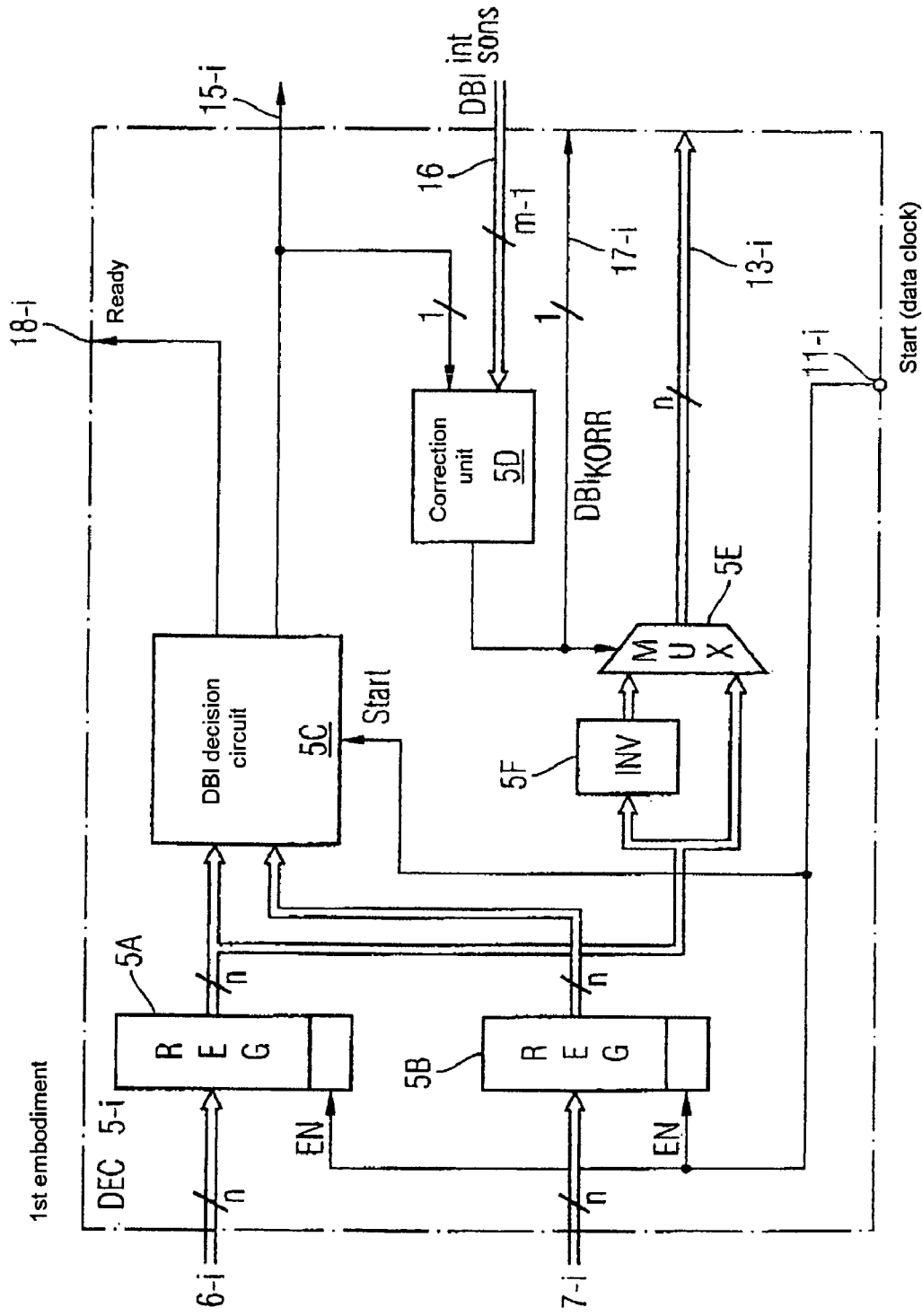
FIG. 8 is a block diagram of a decoder within the circuit unit of FIG. 7.

FIG. 8 shows the circuit design of a decoder 5-*i* within the decoding unit 5, as illustrated in FIG. 7. The decoder 5-*i* optionally contains a first register 5A for buffer-storing the data word $DW_i$ applied to the first data signal input 6-*i*, which data word is read from the burst buffer store 4. In addition, the decoder 5-*i* contains a second optionally provided register 5B, which buffer-stores the reference data word applied to the second data input 7-*i*, which reference data word is formed by the adjacent data word. The two registers 5A, 5B are activated via an internal control line on the basis of the activation control signal (Enable) in order to buffer-store the applied data. The decoder 5-*i* also contains a DBI decision circuit 5C based on the invention, which compares the data bits buffer-stored in the two registers 5A, 5B with one another bit by bit and produces a data bit inversion flag DBI on the basis of the comparison result. If the number of different data bits is greater than half the number of data bits within the data word $DW_i$, the DBI decision circuit 5C sets an internal data bit inversion flag $DBI_i$ and outputs it to the internal bus 16 via an output line 15-*i*. In one preferred embodiment, the internal data bit inversion flag DBI is set to logic high if the number of different data bits is more than half the number (n) of data bits within a data word DW.

In a first embodiment, the decoder 5-*i* shown in FIG. 8 contains an integrated correction unit 5D. The correction unit 5D is formed either by a logic circuit or by a memory. If the correction unit 5D is formed by a logic circuit, it corrects the inversion flag $DBI_i$ produced, which is generated by the comparator 5D, on the basis of those inversion flags which are produced by the comparators in all the other m-1 decoders 5-*i*. The correction unit 5D receives the inversion flags produced by the other decoders 5-*i* via the internal bus 16. The correction unit 5D takes the received inversion flags DBI from the other decoders and the internal inversion flag DBI produced by its own DBI decision circuit 5C as a basis for producing a corrected inversion flag $DBI_{CORR}$, which is output to the parallel/serial converter 14 via an output line 17-*i*, as shown in FIG. 7. The corrected inversion flag $DBI_{CORR}$ also actuates a multiplexer 5E integrated in the decoder 5-*i*. The data word $DW_i$ buffer-stored in the register 5A is applied to a first input of the multiplexer 5E via an inversion unit 5F or to a second input of the multiplexer 5E directly. The corrected inversion flag $DBI_{CORR}$, which is produced by the correction unit 5D, actuates the multiplexer 5E, so that the output lines 13-*i* are used to output the data word $DW_i$ buffer-stored in the register 5A either unchanged or in inverted form. In one preferred embodiment, if the corrected inversion flag $DBI_{CORR}$ is logic high then the data word $DW_i$ buffer-stored in the register 5A is output in inverted form.

In one alternative embodiment of the decoder 5-$i$, the correction unit 5D within the decoder 5-$i$ is formed by a memory in which a table is stored. FIG. 9 shows an example of such a correction table within the correction unit 5D for a decoding unit 5 containing m=4 decoders 5-$i$. The four parallel-connected decoders 5-$i$ within the decoding unit 5 produce four DBI values, which are subjected to recorrection. For four DBI values, there are 16 combination options from which 16 corrected combinations are derived. In the example shown in FIG. 9, each correction unit 5D on all the decoding units 5-$i$ receives the calculated DBI flags via the internal bus 16, i.e. the first four columns of the table in FIG. 9 form the input data for the correction unit 5D. The correction unit 5D in the first decoding unit 5-1 outputs the fifth column of the table as a corrected data bit inversion flag via the associated output line 17-1. The second correction unit 5D within the second decoding unit 5-2 outputs the sixth column as a corrected inversion flag $DBI_{CORR2}$, etc. The correction table shown in FIG. 9 is formed on the basis of the 16 combination options indicated in the first four columns. If the first four columns of the correction table are read row by row, the last four columns of the correction table are obtained by virtue of the procedure that as soon as a bit inversion flag DBI assumes a logic high value (1) the subsequent data bit inversion flags within this row as far as the next logic high value (1) are inverted and the other data bit inversion flags within the row are left, until the next logic 1 appears in the row.

Figure 10:
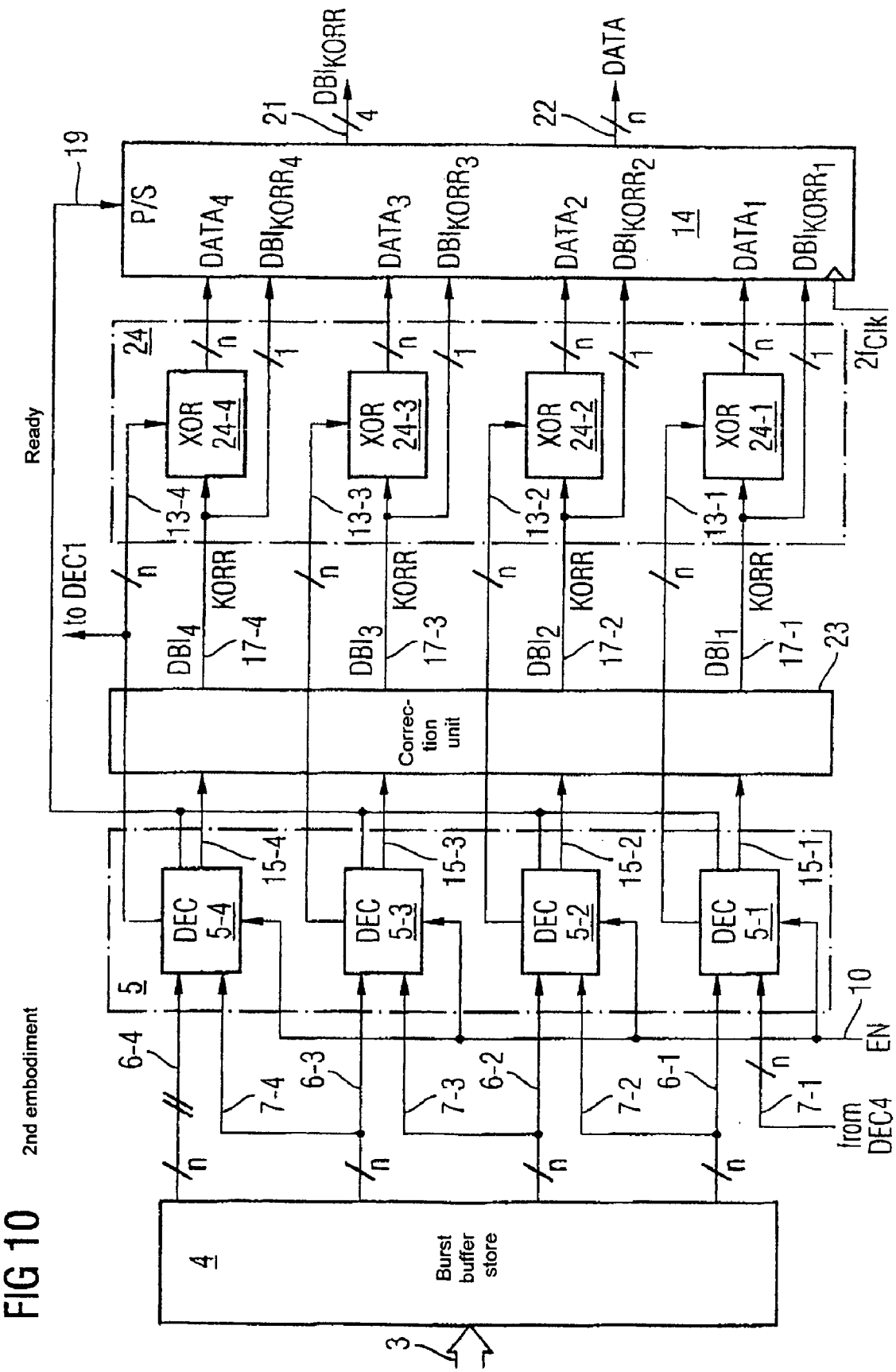
FIG. 10 is a further embodiment of an inventive circuit unit for data bit inversion in a data burst which has been read from a memory chip.

FIG. 10 shows a further alterative embodiment of the circuit unit 1 for data bit inversion in a data burst which has been read from a memory chip. In the circuit shown in FIG. 10, the correction unit is not integrated in the decoding unit 5 but rather forms a separate unit. A correction unit 23 in this arrangement is connected downstream of the decoding unit 5. The inversion unit in this arrangement also forms a separate unit 24. The inversion flags $DBI_i$ produced by the decoders in the decoding unit 5 are supplied to the correction unit 23 via data lines 15-$i$.

Figure 11:
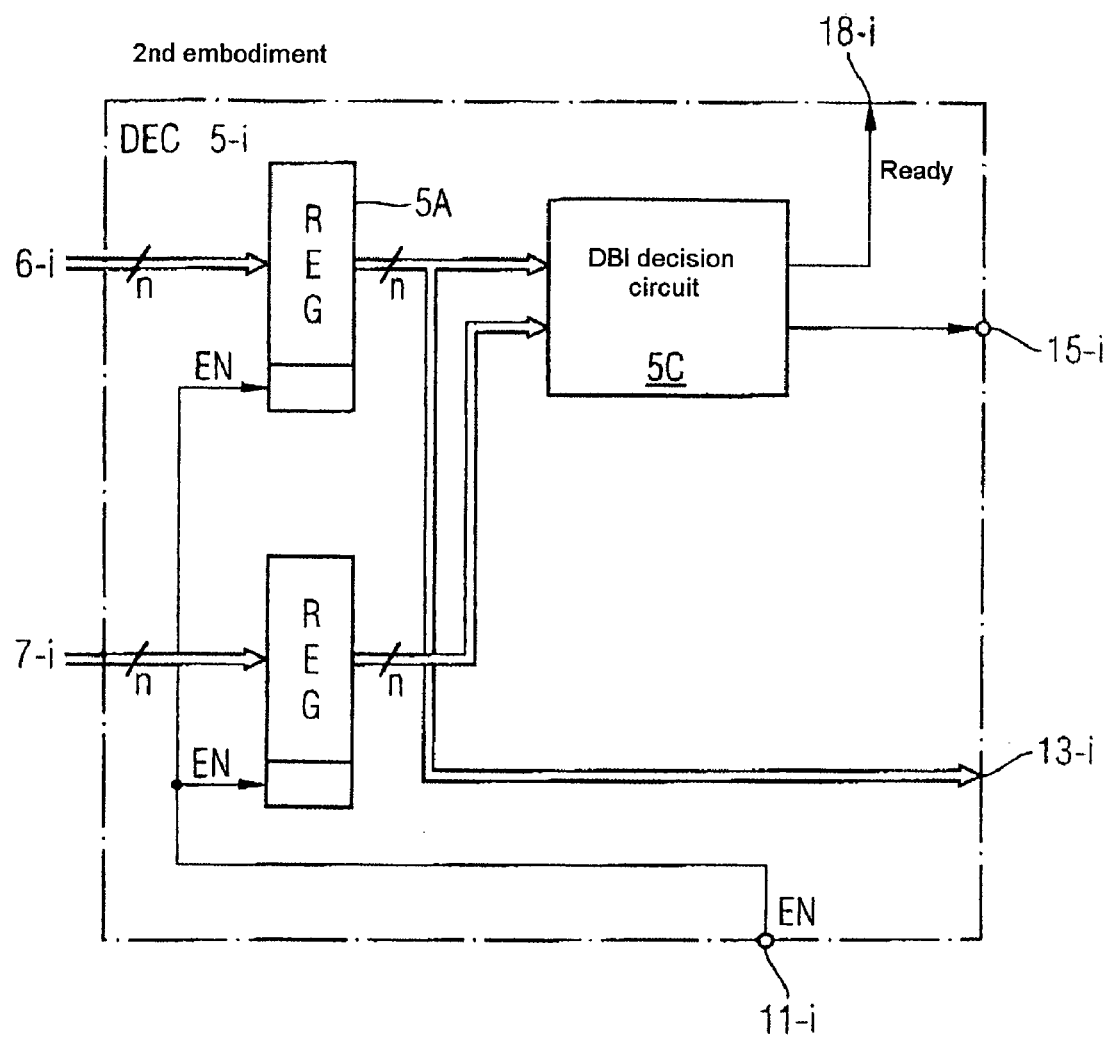
FIG. 11 is a block diagram of a decoder within the circuit unit.

FIG. 11 shows the circuit design of a decoder 5-$i$ within the decoding unit 5 in the circuit unit 1 based on the arrangement shown in FIG. 10. The data word $DW_i$ buffer-stored by the decoder 5-$i$ is output via data lines 13-$i$ to an XOR logic circuit 24-$i$ within the inversion unit 24 and, on the basis of the corrected data bit inversion flags DBI produced by the correction unit 23, is output by the parallel/serial converter 14 in inverted or uninverted form.

Figure 12:
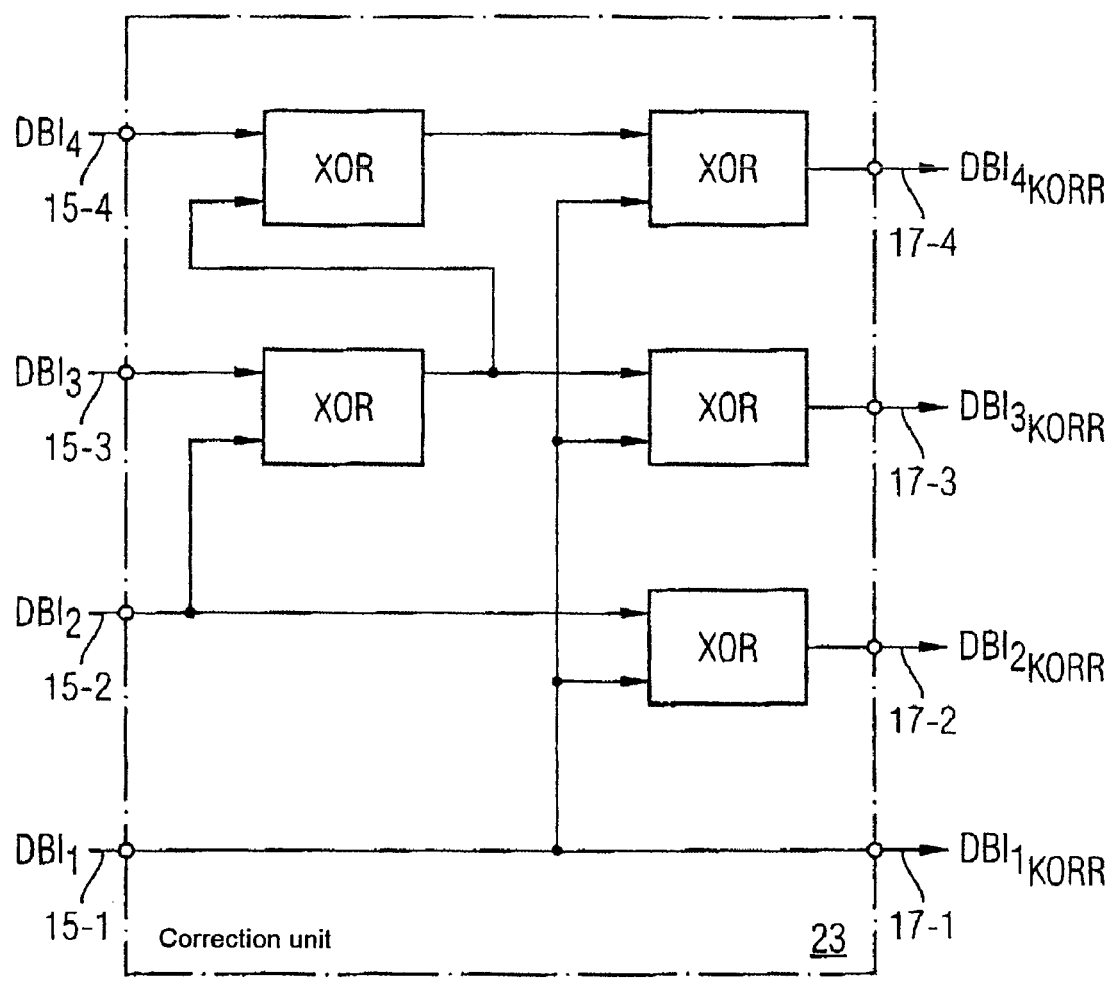
FIG. 12 is a block diagram of a correction unit in the circuit unit of FIG. 10.

FIG. 12 shows a circuit design for the correction unit 23 for a data burst comprising m=4 data words.

Figure 13A:
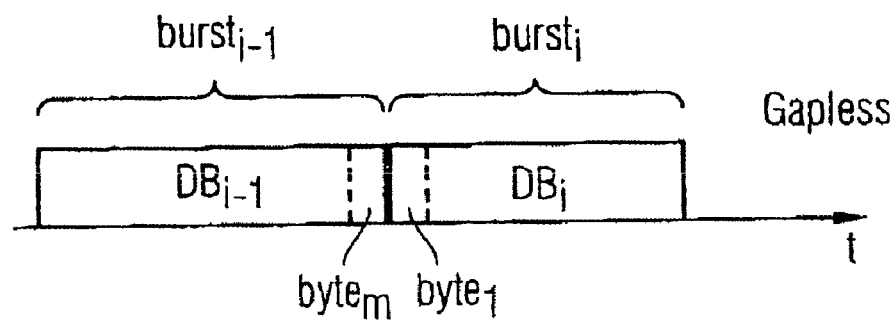
FIG. 13 is a graph to explain a gap between two data bursts for explaining the way in which a preferred embodiment of the circuit unit works.
Figure 13B:
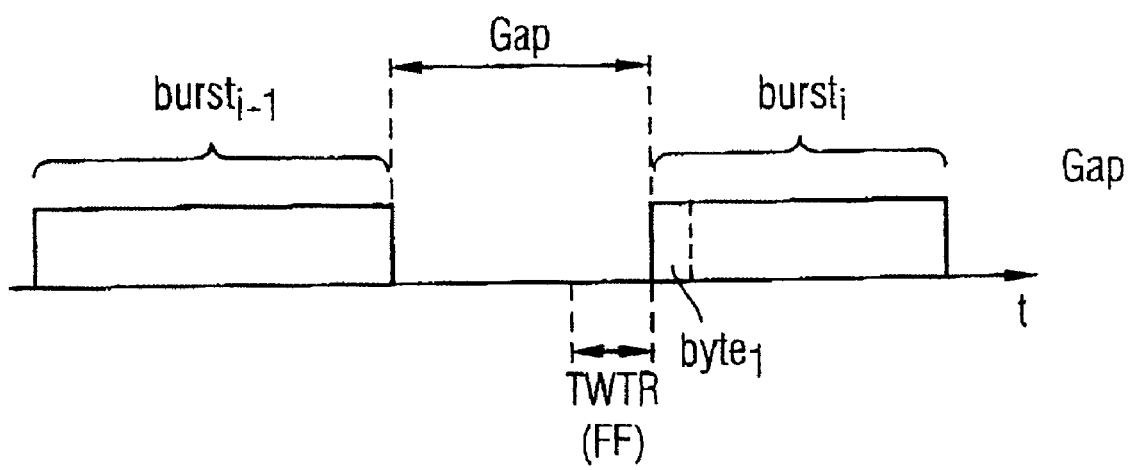

FIG. 13 shows the transmission of data bursts DB in various modes of operation. In the mode of operation shown in FIG. 13A, the data bursts DB are transmitted in gapless fashion, i.e. there are no data gaps between two data bursts. Accordingly, the last data word in the preceding data burst $DB_{i-1}$ can be used as reference data value for the first data word in the next data burst $DB_i$ in this mode of operation. In an alternative mode of operation, in which a data gap occurs, the data bits on the data bus are logic high during a prescribed time TWTR (Time Write to Read), which indicates the minimum interval of time between a write instruction (WR) and a read instruction (RD). These data bits set to logic high can be used as reference data value FF for the data bit inversion, as can be seen in FIG. 13B. During the time TWTR (Time Write to Read), all the data lines are in a defined data state, i.e. all the data lines are pulled to logic high by means of active termination pull-up resistors. Whereas the last data word in the previous data burst $DB_{i-1}$ is used as reference data value in the gapless mode of operation, the operating situation in which a data gap occurs between the data bursts involves a reference data word being used in which all the data are set to logic high, i.e. in the gap mode of operation the reference data word is formed by the value FF.

Figure 14:
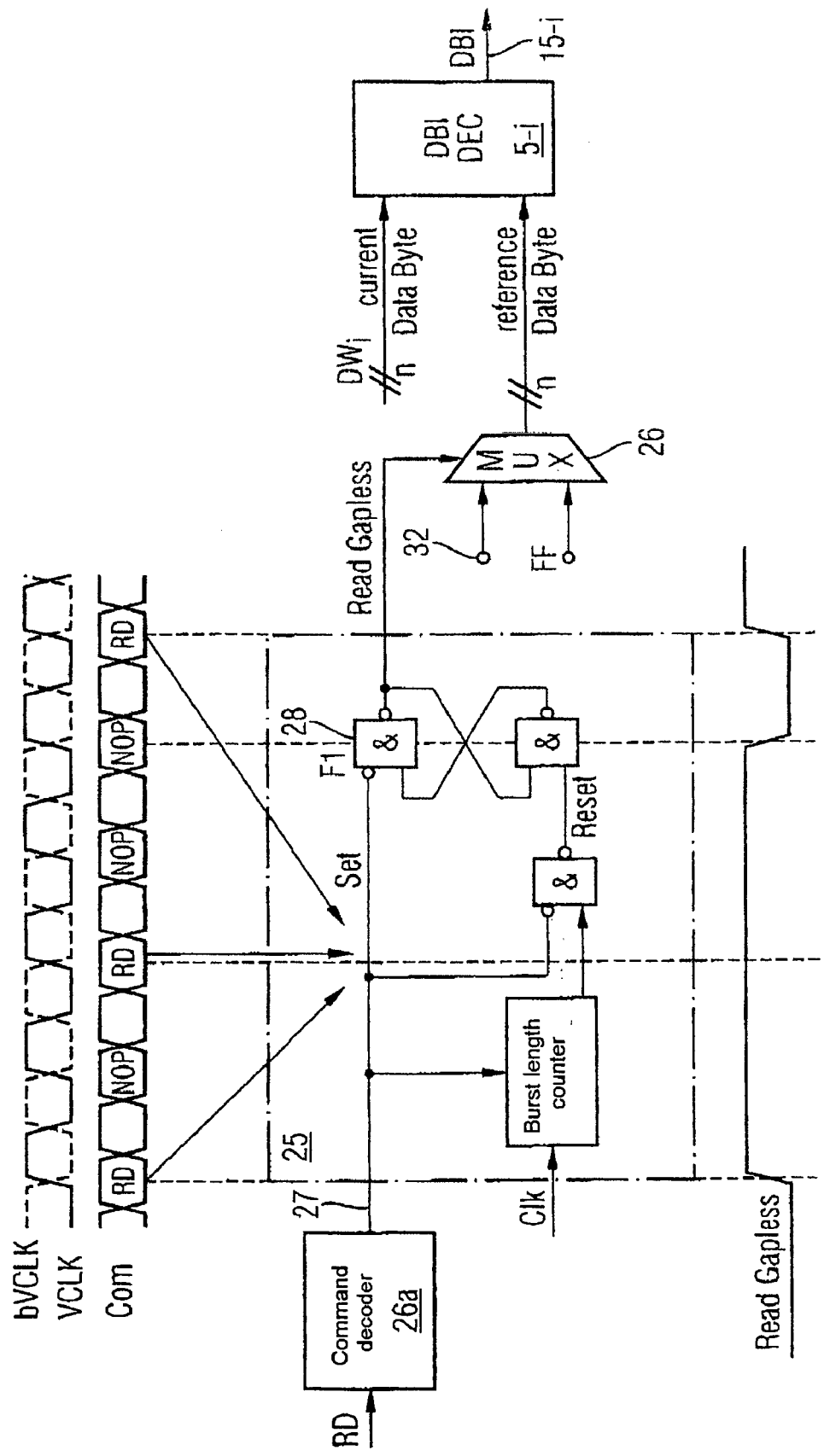
FIG. 14 is a preferred embodiment of a GAP recognition unit used within the circuit unit.

In the circuit unit 1, the decoders 5-$i$ within the decoding unit 5 are preferably extended such that they cover both modes of operation. To this end, each decoder 5-$i$ is provided with a GAP recognition unit 25 which recognizes whether or not there is a data gap between two data bursts DB. The GAP recognition unit 25, as shown in FIG. 14, produces a control signal for a multiplexer 26 on the basis of whether or not the reference data word forms part of a data gap between two bursts DB. As soon as a command decoder 26 within the memory chip recognizes a read instruction (RD), it outputs a trigger signal via a line 27 to the SET input of a flip-flop within the GAP recognition unit 25 and at the same time starts a counter. The counter counts out the length N of a data burst DB, which length is programmed in a register in the memory chip. As soon as the data length N of the data burst has been reached, the counter sends a reset pulse to the flip-flop. In the case of continuous data access, in which no data gap occurs, the reset pulse produced is suppressed by renewed reading on a gate within the GAP recognition unit, so that the control signal (Read Gapless) produced on the control line remains set. When the control signal on the control line is set, i.e. for the gapless operating situation, the reference data word used for the decoders 5-$i$ is the buffer-stored data burst's adjacent data word which is applied to the first signal input of the multiplexer, and which is switched through to the decoder 5-$i$ via data lines as reference data word. If the recognition unit 25 conversely recognizes that a gap has occurred between the two data bursts, as shown in FIG. 13B, the multiplexers 26 is changed over to its second signal input 34, so that the decoder 5-$i$ receives a predetermined reference data word, preferably the reference data word FF.

In the case of continuous data access (Gapless), the reference data value is the last data word which was driven on the bus. In the case of access operations with intervals, the reference data value is formed by a predetermined data word, for example FF. In the case of the GDDR3 and GDDR4 interfaces with the appropriate standard, the data bus is terminated at high level in the idle state when data gaps occur. For the data bit inversion, the result of this is that at the start of the first assessment the reference value is set to high for all data bits.

Figure 15:
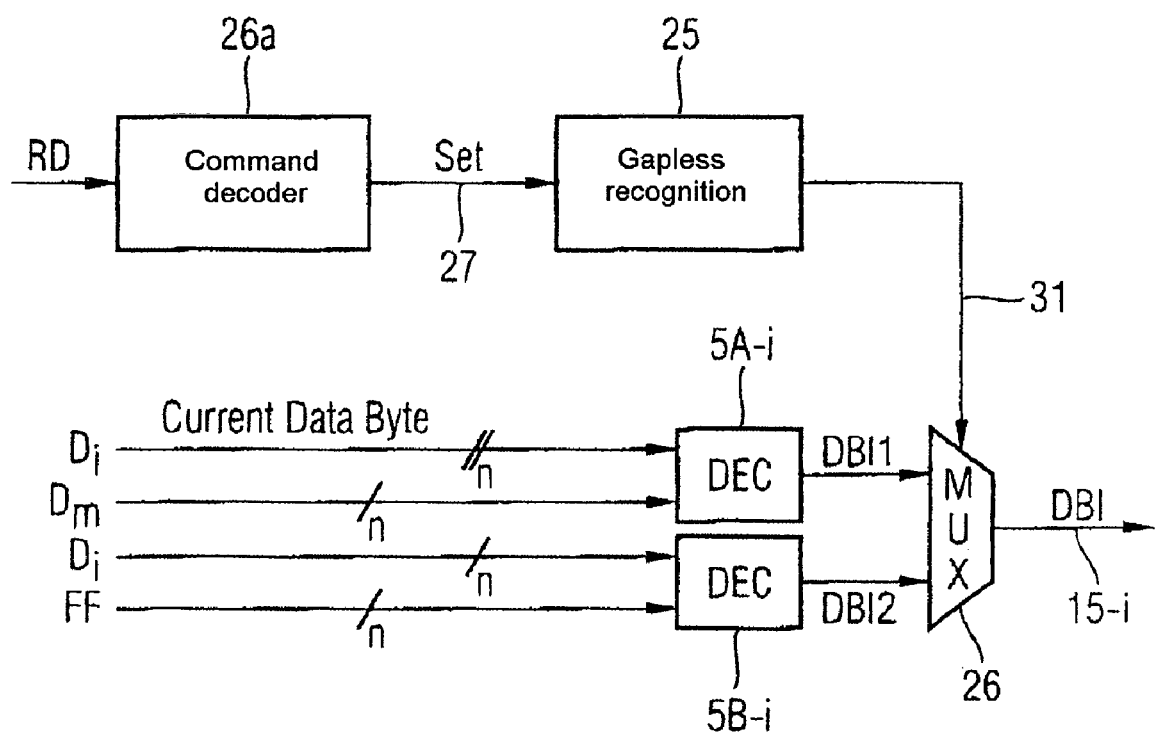
FIG. 15 is a preferred embodiment of the GAP recognition unit used within the circuit unit.

FIG. 15 shows a further improvement in the circuit arrangement shown in FIG. 14. In the case of the embodiment shown in FIG. 15, each decoder 5-$i$ in the decoding unit 5 is replaced by two parallel-connected decoders 5A-i, 5B-i, which are connected upstream of the multiplexer 26. In the case of the embodiment shown in FIG. 14, the gap recognition and the subsequent decoding take place serially in succession, so that this increases the waiting time or access time in line with the duration of the recognition operation. In the case of the preferred embodiment shown in FIG. 15, the data bit inversion flag is produced in parallel for both operating situations, i.e. by the first decoder 5A-i for the case of gapless data bursts and by the decoder 5B-i for the case in which a data gap occurs between two data bursts. In parallel with this, the gapless recognition circuit 25 recognizes which of the two modes of operation is present.

While the data bit inversion flags are produced by the two decoders, the gapless recognition unit 25 recognizes which of the two operating situations is present, so that the waiting time gives the maximum of the two processing times from a gapless unit 25 and from the decoding units 5A, 5B.

$$\Delta T = \max\ (T_{DEC}, T_{GAPDEC}) < T_{GAPDEC} + T_{DEC}$$

The provision of two parallel decoders 5A, 5B reduces the waiting time or memory access time.

Figure 16:
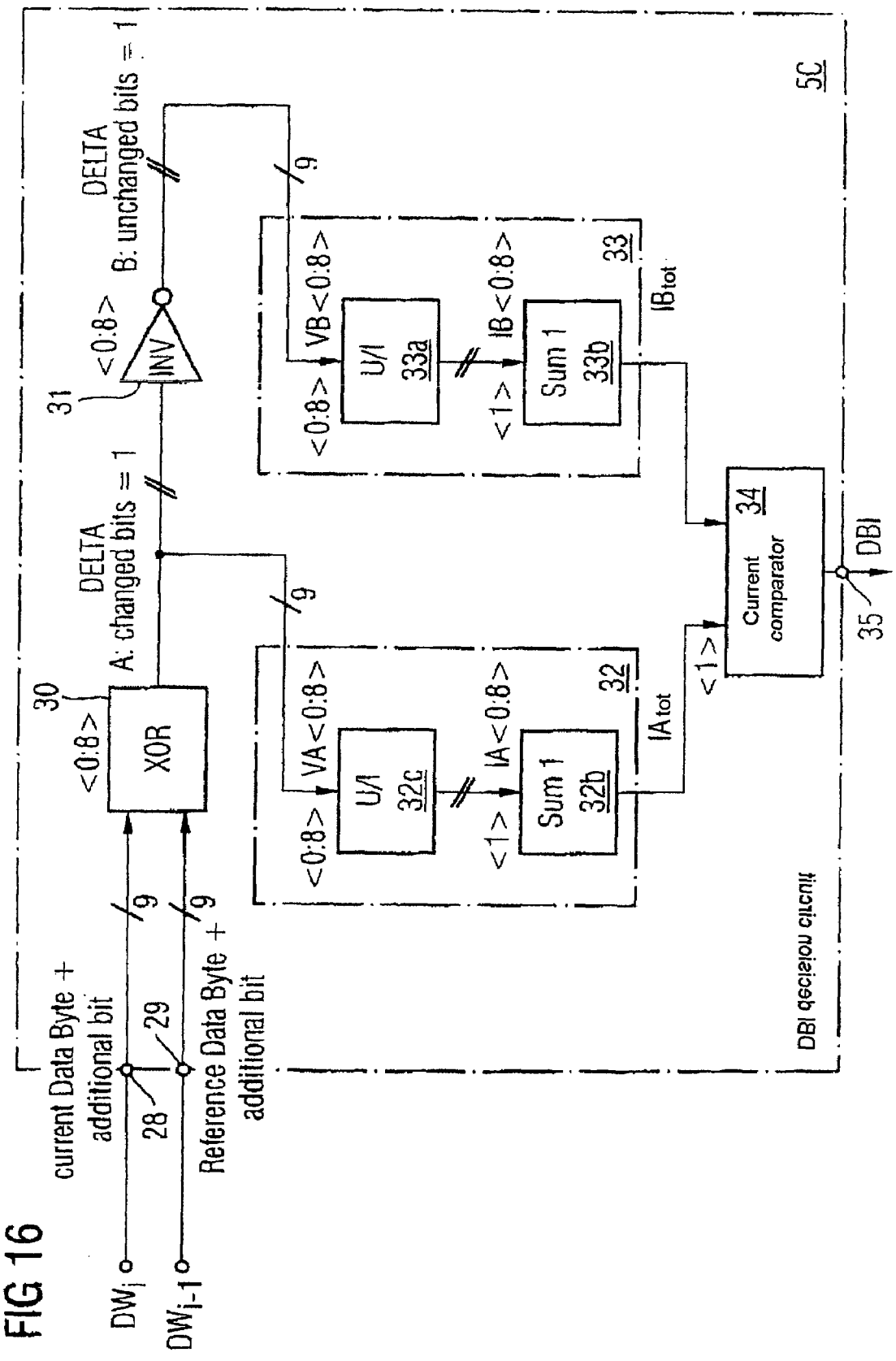
FIG. 16 is a block diagram to explain the principle underlying the data bit inversion decision circuit based on the invention.

FIG. 16 shows a block diagram of the inventive data bit inversion decision circuit 5C to explain the principle underlying the invention.

The data bit inversion decision circuit 5C has a first signal input 28 for applying a present data word $DW_i$ from a data burst DB. The DBI decision circuit 5C also has a second input 29 for applying a reference data word, which is formed by a data word $DW_{i-1}$ adjacent to the present data word $DW_i$. The data words DW in the data burst DB each contain n data bits. If the number n of data bits within a data word is even, the inventive DB decision circuit extends the data word by a supplementary data bit, so that the number n of data bits within a data word is uneven. This ensures a certain decision during current balancing. In one preferred embodiment, the original data words $DW_1$, $DW_{i-1}$ have 8 bits, that is to say one byte, with a respective supplementary data bit being added for the adjacent data words. As can be seen from FIG. 16, the data words extended by the supplementary data bit are supplied to an EXOR circuit 30 comprising 9 EXOR gates. The EXOR circuit 30 performs bit-by-bit comparison between the data bits in the two adjacent data words $DW_1$, $DW_{i-1}$ and outputs a difference data word Delta. The number of data bits with a logic high value within the difference data word Delta indicates the number of different data bits between the two adjacent data words $DW_1$, $DW_{i-1}$. The difference data word Delta is inverted bit by bit by an inversion circuit 33, comprising n+1=9 inverters connected in parallel, to form an inverted difference data word $\overline{\text{Delta}}$. The number of logic high data bits in the inverted difference data word $\overline{\text{Delta}}$ indicates the number of identical bits in the two adjacent data words $DW_1$, $DW_{i-1}$ in the data burst DB.

The difference data word Delta and the inverted difference data word $\overline{\text{Delta}}$ are each supplied to an associated summed-current production unit 32, 33. The summed-current production units each contain a converter 32a, 33a which converts the applied difference data word Delta or inverted difference data word $\overline{\text{Delta}}$ into currents bit by bit, that is to say that each data bit switches an associated current source on or off. The two summed-current production units 32, 33 also have a totalling unit 32b, 33b, which total the currents produced to form a first summed current IA-total or a second summed current IB-total.

A current comparator 34 provided in the inventive DBI decision circuit 5C compares the two summed currents produced IA-total, IB-total and, on the basis of the comparison result, produces the data bit inversion flag (DBI), which is output at an output 35.

The added supplementary data bit, which has a prescribed logic value, for example a logic high value, ensures that the comparison performed by the current comparator 34 always gives a distinct comparison result.

TABLE 1

|  |  | ZDB |
|---|---|---|
| $DW_i$ | 00001010 | 1 |
| $DW_{i-1}$ | 00000101 | 1 |

TABLE 1-continued

|  |  | ZDB |
|---|---|---|
| DELTA | 00001111 | 0 |
| $\overline{\text{Delta}}$ | 11110000 | 1 |
| DBI = 0 |  |  |

Table 1 above shows a simple example to explain the way in which the inventive DBI decision circuit 5C, as shown in FIG. 16, works. In the example shown, two adjacent data words $DW_1$, $DW_{i-1}$ have four different data bits, so that the number of logic high data bits in the difference data from Delta is 4. On account of the supplementary data bit which is added to the two data words $DW_1$, $DW_{i-1}$, the difference data word DELTA has five logic low data bits. Accordingly, the inverted difference data word $\overline{\text{Delta}}$ has five logic high data bits. In the example chosen, the summed current IB-total produced is distinctly larger than the summed current IA-total produced, which means that the data bit inversion flag is distinctly not set by the current comparator 34 (DBI=0). In this embodiment, if the number of different data bits within two adjacent data words is equal to the number of identical data bits in the two adjacent data words then the data bit inversion flag DBI is therefore not set by the inventive data bit inversion decision circuit 5C.

If the supplementary data bit is set to a logic low value in the example shown in Table 1 then if the number of identical data bits is equal to the number of nonidentical data bits the data bit inversion flag DBI is set in this case.

Figure 17:
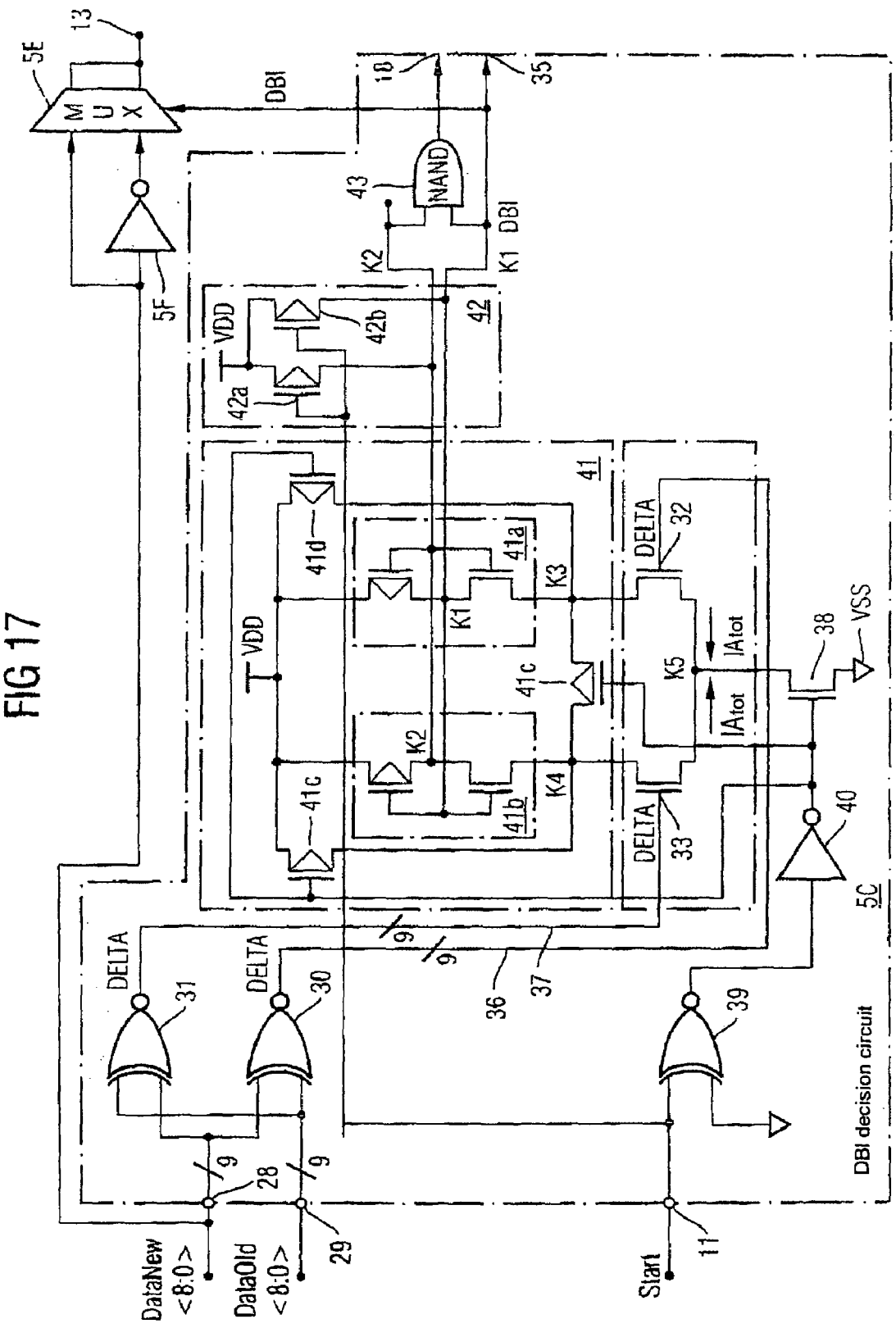
FIG. 17 is a first embodiment of the inventive circuit for producing a data bit inversion flag.

FIG. 17 shows a first embodiment of the inventive data bit inversion decision circuit 5C. In the preferred embodiment shown, the extended data words DW, including the supplementary data bit, have 9 bits. Nine EXOR gates 30 connected up in parallel produce the difference value Delta, and nine EXNOR gates 31 connected up in parallel produce the inverted difference data value $\overline{\text{Delta}}$.

The difference data value Delta uses nine control lines 36 to actuate a summed-current production unit 32 comprising nine MOS transistors connected up in parallel. The inverted difference data value $\overline{\text{Delta}}$ likewise uses nine control lines 37 to actuate a summed-current production unit 33 comprising nine n-MOS transistors connected up in parallel. A node K5 connects the two summed-current production units 32, 33, which can be connected to a negative supply voltage potential VSS via a transistor 38. The first summed-current production unit 32 produces a first summed current like ATOT, whose amplitude is proportional to the number of different data bits in the two adjacent data words DW in the data burst. The second summed-current production unit 33 produces a second summed current IB-total, whose amplitude is proportional to the number of identical data bits in the two adjacent data words DW in the data burst DB. The switching N-MOS transistor 38 is actuated on the basis of the start control signal which is applied to the control connection 11. A DUMMY inverter 39, for example in the form of an XNOR gate, is provided for the purpose of compensating for the signal propagation time in the gates 30, 31. A further inverter 40 covers a set-up time delay. The start control signal 11 is preferably formed by a data clock signal.

The data bit inversion decision circuit 5C based on the invention also contains a current comparator 41, which is formed by a differential amplifier 41 in the case of the embodiment shown. The differential amplifier 41 contains a first inverter stage 41a and a second inverter stage 41b, which each comprise two complementary transistors. The two complementary transistors in the first inverter stage 41a are connected to one another at a first node K1. The two complementary transistors in the second inverter stage 41b are connected to one another at a second node K2. The current comparator or differential amplifier 41 is connected to the first summed-current production unit 32 at a third node K3 and to the second summed-current production unit 33 at a fourth node K4. The third node K3 and the fourth node K4 of the differential amplifier 41 can preferably be shorted by means of a transistor when the DBI decision circuit 5C is deactivated.

The PMOS transistors shown in FIG. 17 are actuated by the delayed start control signal. When the inventive decision circuit 5C is in the turned-off state, the PMOS transistors at the nodes K3 and K4 are pulled to the positive supply voltage potential VDD by shorting the PMOS transistors 41c, 41d, 41e in the differential amplifier 41.

When the DBI decision circuit 5c is in the activated state, the switching transistor 38 is turned on and the PMOS transistors 41c, 41d, 41e turn off. At the node K1, a logic high potential VDD appears if the summed current IA-total produced by the first summed-current production unit 32 is higher than the summed current IB total produced by the second summed-current production unit 33.

The inventive DBI decision circuit 5C also contains a Pull-UP circuit 42 with two PMOS transistors 42a, 42b, which are actuated on the basis of the start control signal. The Pull-UP circuit 42 keeps the nodes K1 and K2 at the positive supply potential VDD in the deactivated state of the decision circuit 5C.

A NAND gate 43 logically combines the two values which are present on the nodes K1 and K2. In the deactivated state of the decision circuit 5C, both nodes K1 and K2 are at the logic high value, so that the Ready indicator signal (Ready) at the output 18 is logic low. If the two nodes K1 and K2 have different logic values, that is to say if the decision circuit 5C is in the activated state and performs a comparison, then the NAND gate 43 outputs a Ready indicator signal with a logic high value after the comparison has been performed. If the first summed current IA-total is larger than the second summed current IB-total, the potential on the node K1 is logic high, that is to say that the data bit inversion flag DBI for actuating the multiplexer 5e is set to logic high. As can be seen from FIG. 17, the two summed-current production units 32, 33, the current comparator 41 and the Pull-UP circuit 42 are of purely analogue design, which means that the processing speed for producing the data bit inversion flag DBI is relatively high. The first embodiment of the inventive DBI decision circuit 5C shown in FIG. 17 also has a digital EXOR gate 30 and EXNOR gate 31, however.

Figure 18:
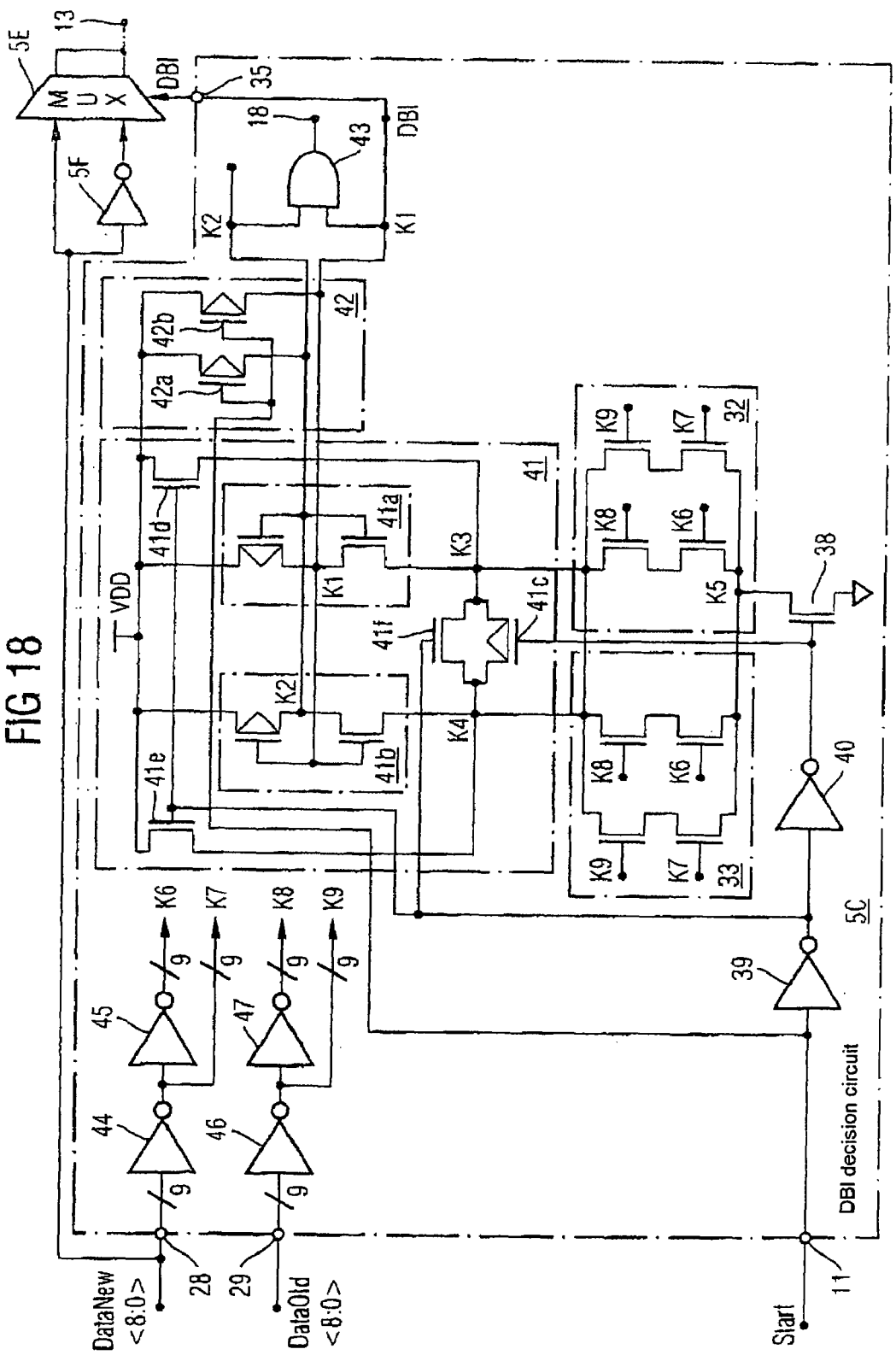
FIG. 18 is a second embodiment of the inventive circuit for producing a data bit inversion flag.

The particularly preferred embodiment of the inventive DBI decision circuit 5C which is shown in FIG. 18 is of purely analogue design, since the functionality of the EXOR and EXNOR gates is integrated in the summed-current production circuits 32, 33. In the case of the variant of the differential amplifier 41 which is shown in FIG. 18, the PMOS transistors 41d and 41e have been replaced by N-MOS transistors. In addition, a further N-MOS transistor 41f is provided which is connected in parallel with the PMOS transistor 41e.

In the case of the embodiment shown in FIG. 18, the EXOR gates 30 and the EXNOR gates 31 in the first embodiment have been replaced by inverters 44, 45, 46, 47, whose output-side nodes K6, K7, K8, K9 actuate a first current production unit 32 and a second current production unit 33. The two current production units 32 and 33 each comprise two signal paths with two respective series-connected N-MOS transistors.

Table 2 below shows the various switching states of the current production units 32, 33. By way of example, in switching state Z1 the two nodes K7, K9 are both at logic 0, so that the connected signal paths are off. In the preferred embodiment shown in FIG. 18, the logic is thus integrated into the summed-current production units 32, 33.

TABLE 2

| State | Node | XOR | XNOR |
|---|---|---|---|
| Z1 | 00 | 0 | 1 |
| Z2 | 01 | 1 | 0 |
| Z3 | 10 | 1 | 0 |
| Z4 | 11 | 0 | 1 |

A further advantage of the embodiment shown in FIG. 18 is that the number of N-MOS transistors far outweighs that of the PMOS transistors. Since PMOS transistors for integration need to be far larger so that they have the same speed, the chip area required can be reduced by reducing the number of said transistors. In addition, implementing the logic in the current control circuits minimizes the number of transistors required overall in the embodiment shown in FIG. 18. The preferred embodiment shown in FIG. 18 has a very small expansion value for producing the data bit inversion flag DBI. In the embodiment shown in FIG. 18, the decision time is approximately 400 ps. The short decision time means that the memory access time becomes shorter overall. A typical value for the memory access time in a DRAM memory without data bit inversion is 12 ns. If data bit inversion is provided, the memory access time in a conventional circuit is increased to 14 ns. In the case of a DRAM chip, which contains the inventive data bit inversion circuit and, in particular, the inventive circuit 5c for producing a data bit inversion flag, the memory access time is just approximately 12.5 ns.

Figure 19:
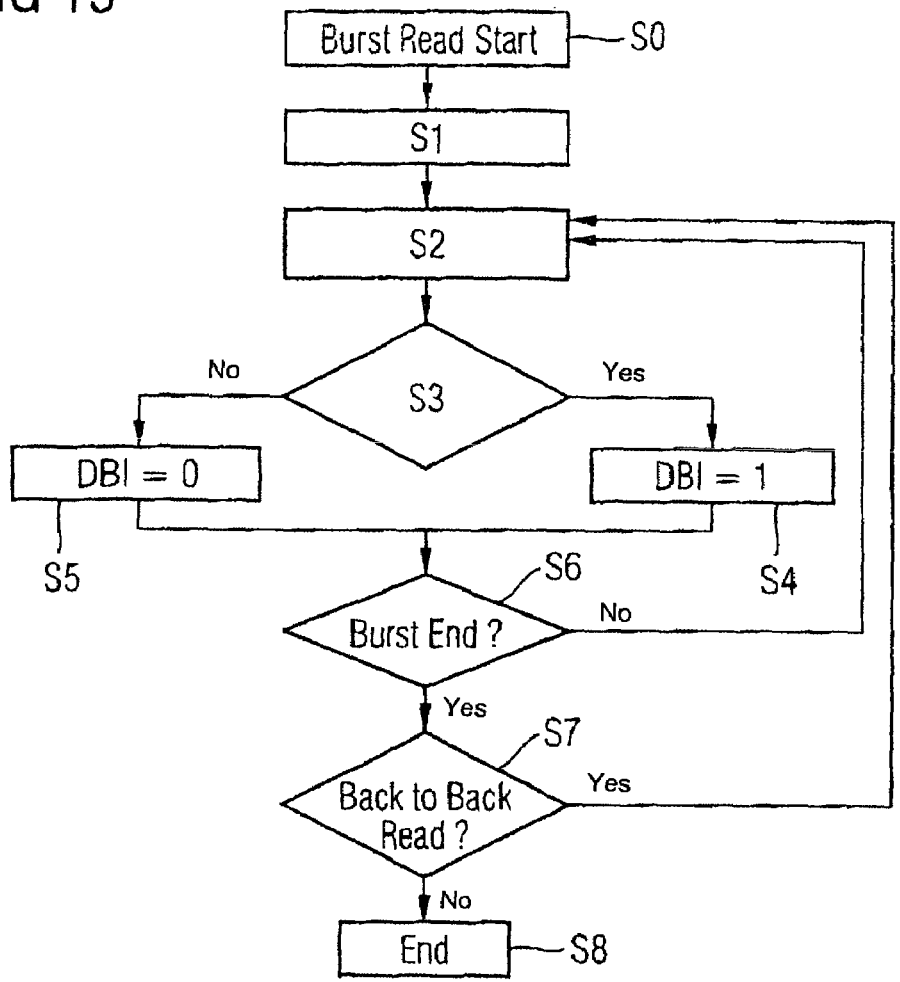
FIG. 19 is a flowchart to explain the inventive method for producing a data bit inversion flag.

FIG. 19 shows a flowchart to explain the way in which the inventive method for producing a data bit inversion flag DBI works.

Following a starting step S0, that is to say after an instruction to read a data burst DB has been given, initialization takes place in a step S1, which involves the reference data word and the data bit inversion flag being initialized to logic high values.

In a step S2, the number of different data bits between the two adjacent data words DW and the data burst DB is ascertained.

In a step S3, a check is performed to determine whether the number of different data bits is greater than the number of half the total data bits present in a data word DW. If the number of a bit provided in the data word DW is one byte or 8 bits, a check is performed in step S3 to determine whether the number of different data bits is greater than 4. If the number is greater than 4, the data bit inversion flag DBI is set to logic high in a step S4 and the currently applied data word DW is inverted as appropriate. If, conversely, the number of different data bits is less than 4, the data bit inversion flag DBI is set to logic low and the currently applied data word DW is not inverted in step S5.

In a step S6, a check is then performed to determine whether or not the data burst DB has ended. If the data burst DB is not yet ended, the procedure returns to step S2. In the converse case, a check is performed in step S7 to determine whether a further data burst DB K+1 directly follows the existing data burst DBk. If this is the case, the procedure returns to step S2. In the converse case, the procedure is ended in step S8.

Figure 20:
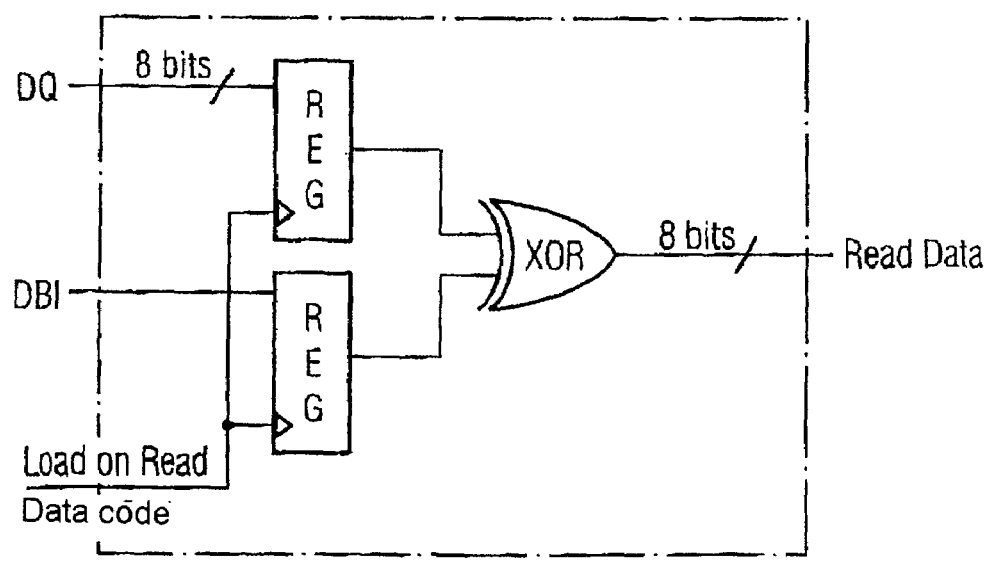
FIG. 20 is a block diagram to illustrate the back-inversion within a controller.

FIG. 20 shows the back-inversion on the basis of the received data bit inversion flag DBI within the controller connected to the DRAM chip. The received data are back-inverted on the basis of the data bit inversion flag DBI, that is to say that if the data bit inversion flag is at logic high then the received data are inverted using EXOR gates.

The inventive data bit inversion circuit 5c is suitable for any circuit arrangement in which a decision circuit is required for producing a data bit inversion flag. The inventive data bit inversion decision circuit 5C, as shown in FIGS. 18 and 19, can be used within decoders which are cascaded or connected up in parallel. Even decoders which perform serial processing of the data words in a data burst in conventional fashion can have their speed increased by using the inventive data bit inversion decision circuit 5C.

Although modifications and changes may be suggested by those skilled in the art, it is the intention of the inventor to embody within the patent warranted heron all changes and modifications as reasonably and properly come within the scope of his contribution to the art.

I claim as my invention:

1. A circuit for producing a data bit inversion flag, comprising:
    a first summed-current production unit for producing a first summed current, whose amplitude is proportional to the number of different data bits in two adjacent data words in a data burst;
    a second summed-current production unit for producing a second summed current, whose amplitude is proportional to the number of identical data bits in said two adjacent data words; and
    a current comparator comparing said first summed current with said second summed current and producing a data bit inversion flag if said first summed current is greater than said second summed current.

2. The circuit of claim 1, wherein said two summed-current production units each comprise transistors connected in parallel; said transistor switching on the basis of said data bits.

3. The circuit of claim 2, wherein said two complementary transistors in said first inverter stage are connected to one another at a first node.

4. The circuit of claim 3, wherein said transistors in said first inverter stage are MOS or NMOS field-effect transistors.

5. The circuit of claim 3, wherein said two complementary transistors in said second inverter stage are connected to one another at a second node.

6. The circuit of claim 5, wherein said first node and said second node are held at a prescribed supply potential in a deactivated state of said circuit by means of a PULL-UP circuit.

7. The circuit of claim 6, wherein said PULL-UP circuit comprises transistors which are switched on the basis of a start control signal.

8. The circuit of claim 7, wherein said transistors of said PULL-UP circuit are MOS field-effect transistors or MOS field-effect transistors.

9. The circuit of claim 3, wherein said data bit inversion flag is tapped off for output at said first node.

10. The circuit of claim 3, wherein said two complementary transistors in said second inverter stage are connected to one another at a second node and said first node and said second node are connected to a NAND gate for producing a Ready indicator signal.

11. The circuit of claim 2, wherein said transistors in said second inverter stage are MOS or NMOS field-effect transistors.

12. The circuit of claim 1, wherein said two adjacent data words each have an added supplementary data bit with a fixed logic value so that the number of said data bits within a data word is always uneven.

13. The circuit of claim 1, wherein said current comparator is formed by a differential amplifier.

14. The circuit of claim 1, wherein said current comparator is clocked by a data clock signal.

15. The circuit of claim 14, wherein said circuit can be activated by a start control signal which is formed by said data clock signal.

16. The circuit of claim 15, wherein said first summed-current production unit and said second summed-current production unit are connected to one another at a fifth node which can be connected by a transistor to, a prescribed supply voltage potential on the basis of said start control signal.

17. The circuit of claim 16, wherein said transistor which can connect said fifth node to said prescribed supply voltage potential are MOS field-effect transistors or MOS field-effect transistors.

18. The circuit of claim 1, wherein said current comparator comprises two inverter stages each having two complementary transistors.

19. The circuit of claim 18, wherein said transistors of said current comparator are MOS or NMOS field-effect transistors.

20. The circuit of claim 1, wherein said current comparator is connected to said first current production unit at a third node and to said second current production unit at a fourth node.

21. The circuit of claim 20, wherein said third node and said fourth node are shorted via at least one further transistor when said circuit has been deactivated.

22. The circuit of claim 1, wherein said first summed-current production unit and said second summed-current production unit are connected to one another at a fifth node.

23. The circuit of claim 1, wherein said data bit inversion flag actuates a multiplexer which takes said data bit inversion flag as a basis for switching through the present of said two adjacent data words in inverted or uninverted form.

24. A method for producing a data bit inversion flag, comprising the steps of:
    producing a first summed current, whose amplitude is proportional to the number of different data bits in two adjacent words in a data burst;
    producing a second summed current, whose amplitude is proportional to the number of identical data bits in said two adjacent data words in a data burst;
    comparing said first summed current with said second summed current; and
    setting a data bit inversion flag to a logic value if said first summed current is greater than said second summed current.

* * * * *